(12) United States Patent
Schmidt-Lange et al.

(10) Patent No.: US 9,373,530 B2
(45) Date of Patent: Jun. 21, 2016

(54) TOOL FOR PICKING A PLANAR OBJECT FROM A SUPPLY STATION

(75) Inventors: Michael Schmidt-Lange, North Wales, PA (US); Kam-Shing Wong, Telford, PA (US); Johannes Schuster, Kreuzlingen (CH)

(73) Assignee: Kulicke and Soffa Die Bonding GmbH, Berg (CH)

( * ) Notice: Subject to any disclaimer, the term of this patent is extended or adjusted under 35 U.S.C. 154(b) by 942 days.

(21) Appl. No.: 13/395,019
(22) PCT Filed: Sep. 9, 2010
(86) PCT No.: PCT/EP2010/063267
§ 371 (c)(1),
(2), (4) Date: Mar. 8, 2012
(87) PCT Pub. No.: WO2011/029890
PCT Pub. Date: Mar. 17, 2011

(65) Prior Publication Data
US 2012/0168089 A1 Jul. 5, 2012

Related U.S. Application Data

(60) Provisional application No. 61/240,858, filed on Sep. 9, 2009.

(30) Foreign Application Priority Data

Jun. 7, 2010 (EP) .................................... 10165160

(51) Int. Cl.
*H01L 21/67* (2006.01)
*H01L 21/683* (2006.01)
(Continued)

(52) U.S. Cl.
CPC .......... *H01L 21/67144* (2013.01); *B65G 47/91* (2013.01); *H01L 21/00* (2013.01); *H01L 21/68* (2013.01); *H01L 21/6838* (2013.01); *Y10T 156/17* (2015.01)

(58) Field of Classification Search
CPC ..... H01L 21/00; H01L 21/68; H01L 21/6838; H01L 21/67144; H01L 21/6835; H01L 24/29; H01L 21/67132; B65G 47/91; B65H 37/04; B32B 37/10; B32B 37/1018; B29C 66/82661; B29C 70/44; B29C 70/342; Y10T 156/17
USPC .......................... 156/247, 249, 285, 934, 556
See application file for complete search history.

(56) References Cited

U.S. PATENT DOCUMENTS 3,774,834 A * 11/1973 Holler .................... B23K 20/02
228/4.1
4,052,241 A * 10/1977 Walter .................... B29C 51/16
156/245

(Continued)

FOREIGN PATENT DOCUMENTS

EP 0235781 A2 9/1987
EP 0312924 A2 * 4/1989

(Continued)

OTHER PUBLICATIONS

English translation of JP2000-195877, Matsumara et al. Jul. 14, 2000.*

(Continued)

*Primary Examiner* — Sonya Mazumdar
(74) *Attorney, Agent, or Firm* — Stradley Ronon Stevens & Young, LLP

(57) ABSTRACT

A pick tool for picking a planar object from a supply station is presented, in particular to be used for picking a semiconductor die from a carrier tape, said pick tool comprising: a work surface, said work surface comprising at least one contact region that may be brought into contact with a first surface on a first side of the planar object; one or more vacuum outlets in the work surface that may be connected to a vacuum source to allow for temporarily fixing the planar object to the work surface; and wherein a flexible seal is provided to maintain vacuum if the planar object becomes deformed.

15 Claims, 11 Drawing Sheets

(51) Int. Cl.
  *H01L 21/687* (2006.01)
  *B65G 47/91* (2006.01)
  *B32B 37/10* (2006.01)
  *H01L 21/00* (2006.01)
  *H01L 21/68* (2006.01)
  *B32B 37/26* (2006.01)

(56) References Cited

U.S. PATENT DOCUMENTS

| | | | | |
|---|---|---|---|---|
| 4,850,780 | A * | 7/1989 | Safabakhsh | H01L 21/67132 156/765 |
| 5,803,797 | A * | 9/1998 | Piper | B24B 37/30 125/12 |
| 6,279,976 | B1 * | 8/2001 | Ball | B65G 47/91 279/3 |
| 8,037,918 | B2 * | 10/2011 | Wang | H01L 21/6838 156/285 |
| 8,132,608 | B2 * | 3/2012 | Chen | B65H 37/04 156/538 |
| 2002/0024883 | A1 * | 2/2002 | Odashima | H01L 21/67144 365/52 |
| 2002/0069952 | A1 | 6/2002 | Kurosawa | |
| 2003/0034120 | A1 * | 2/2003 | Yanagisawa | B44C 1/105 156/238 |
| 2003/0115747 | A1 * | 6/2003 | Schnetzler | H01L 21/6838 29/830 |
| 2009/0269178 | A1 | 10/2009 | Trinks | |
| 2014/0060751 | A1 * | 3/2014 | Yamamoto | H01L 21/67132 156/758 |

FOREIGN PATENT DOCUMENTS

| | | |
|---|---|---|
| EP | 1209724 A2 | 5/2002 |
| JP | 2000-195877 | 7/2000 |
| WO | WO2007/118511 A1 | 10/2007 |
| WO | WO2008/130173 A1 | 10/2008 |

OTHER PUBLICATIONS

English translation of DE4328155A1, Hager. Feb. 23, 1995.*
Written Opinion of WO2011029890.*
International Search report from PCT Patent Application No. PCT/EP2010/063267 completed on Jan. 24, 2011.

* cited by examiner

TOOL FOR PICKING A PLANAR OBJECT FROM A SUPPLY STATION

CROSS REFERENCE TO RELATED APPLICATION

This application claims the benefit of International Application No. PCT/EP2010/063267 filed Sep. 9, 2010, which claims the benefit of European Patent Application No. 10165160.2 filed Jun. 7, 2010 and U.S. Provisional Patent Application No. 61/240,858, filed Sep. 9, 2009, the content of all of which are incorporated herein by reference.

FIELD OF THE INVENTION

The present invention pertains to the field of automation technology. It relates to a device for picking chips from a supply station, in particular semiconductor dies from a carrier tape, in accordance with the preamble of the independent patent claims.

BACKGROUND OF THE INVENTION

One of the biggest challenges in semiconductor packaging is picking, handling and processing of very thin semiconductor chips. The semiconductor chips are generally provided on a carrier tape, which generally contains a whole semiconductor wafer that has been cut into small chips, a process frequently referred to as dicing. The semiconductor chips are thus commonly referred to as dies. The carrier tape is often the same tape that supported the wafer during dicing, often referred to as dicing tape. Die thicknesses of down to 25 µm are common today, and there is an ongoing trend to decrease thicknesses even further. Consequently, features on a structured side of such thin dies usually have maximum heights of only a few micrometers.

Die bonders pick a single die from the carrier tape and place and subsequently attach the picked die onto a substrate or onto another die. In most situations, the die is attached permanently, but configurations where dies are only attached temporarily also exist. Often, a temporary attachment is subsequently turned into a permanent one by an additional heating and/or pressing process. Often, thin dies come with a wafer backside lamination (WBL) or film or flow over wire (FOW) lamination, i.e. an adhesive film which is applied to an unstructured side of the wafer or die. A process of thinning wafers, applying an adhesive film to the wafers, mounting the wafers to a carrier tape and frame, and dicing them into individual chips is usually referred to as wafer preparation. The lamination, which allows for the dies to be attached due to its adhesive properties, may be provided either between the carrier tape and the wafer, or on a surface of the wafer facing away from the carrier tape.

Picking and placing may be carried out by a single die handling unit in the die bonder as illustrated in FIG. 1. In modern die bonders, e.g. as shown in FIG. 2, a plurality of die handling units can be present: In general, picking takes place from a so called wafer table, and is assisted by a first die handling unit, also referred to as die ejector 5. The die ejector 5 facilitates the removal of the die 30 from the carrier tape 4, e.g. by pushing the die 30 against a second die handling unit called pick unit 92—from underneath the carrier tape 4. The pick unit 92 subsequently picks the die 30 from the carrier tape 4 in a pick process and hands it over to a third die handling unit, also referred to as place unit 94. The place unit 94 places the die 30 onto a target position, where it is attached. In some cases, at least one fourth die handling unit—a so called transfer unit 93—is provided to hand the die 30 from the pick unit 92 to the place unit 94. An example is given in WO 07118511 A1 which is hereby incorporated by reference in its entirety. In this manner, a die 30 may be attached to a substrate 6, e.g. a leadframe, printed circuit board, multilayer board etc., or to another die, which itself may be have been attached in the same way. A plurality of cameras 40, 41, 42, 44 is normally present for monitoring and/or measuring purposes.

The fabrication of very thin wafers and the corresponding dies is very expensive as compared to standard thickness wafers without lamination. Sawing, picking as well as handling of very thin dies have significant yield losses. Most of the yield is lost during wafer preparation, die picking, or subsequent handling, resulting in damaged dies due to typical defects as e.g. broken dies, cracked dies, chipped dies, etc. Both place and attachment processes, in comparison, are more reliable, giving rise to only negligible loss.

During picking, damage frequently results from bending a die beyond an elastic range. This occurs when the die 30, while still being attached to the carrier tape 4 is grabbed by a pick tool 1 and subsequently detached from the carrier tape 4 as shown in FIG. 3. This is usually done by bringing a work surface of the pick tool into contact with a first surface of the die 30 which faces away from the carrier tape 4, fixing the die 30 to the work surface by means of a vacuum, and moving the pick tool 1 away from the carrier tape 4 which is thus peeled off of the die 30. During peeling, regions of the carrier tape 4 underneath positions of neighboring dies 31, 32 are generally held in place on a support surface of a die ejector 5 by vacuum. As a consequence, the carrier tape 4 exerts a reactionary force onto the die 30 away from the work surface. As air can easily enter between the die 30 and the work surface at an edge of the die 30, vacuum often breaks down in an area near the edge so that the die 30 looses contact to the work surface in said area. The area near the edge of the die 30 is then bent down. This may lead to breaking, cracking or chipping of the die 30 if a bending radius becomes too small. It may also result in the die 30 becoming completely detached from the pick tool 1. In this case, picking has to be repeated, resulting in reduced performance of the die bonder.

SUMMARY OF THE INVENTION

It is thus an object of the invention to provide a pick tool that overcomes the disadvantages described above. In particular, the pick tool shall allow for a vacuum to be maintained while a planar object is picked from a supply station, even if the planar object becomes deformed.

The above objects are achieved by a pick tool according to the independent claims.

In an exemplary embodiment of the present invention, a pick tool for picking a planar object from a supply station, in particular for picking a semiconductor die from a carrier tape, comprises a work surface, said work surface comprising at least one contact region that may be brought into contact with a first surface on a first side of the planar object; one or more vacuum outlets in the work surface that may be connected to a vacuum source to allow for temporarily fixing the planar object to the work surface. A flexible seal is provided to maintain vacuum if the planar object becomes deformed.

The aforementioned and further objectives, advantages and features of the invention will be detailed in the description of preferred embodiments below in combination with the drawings.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
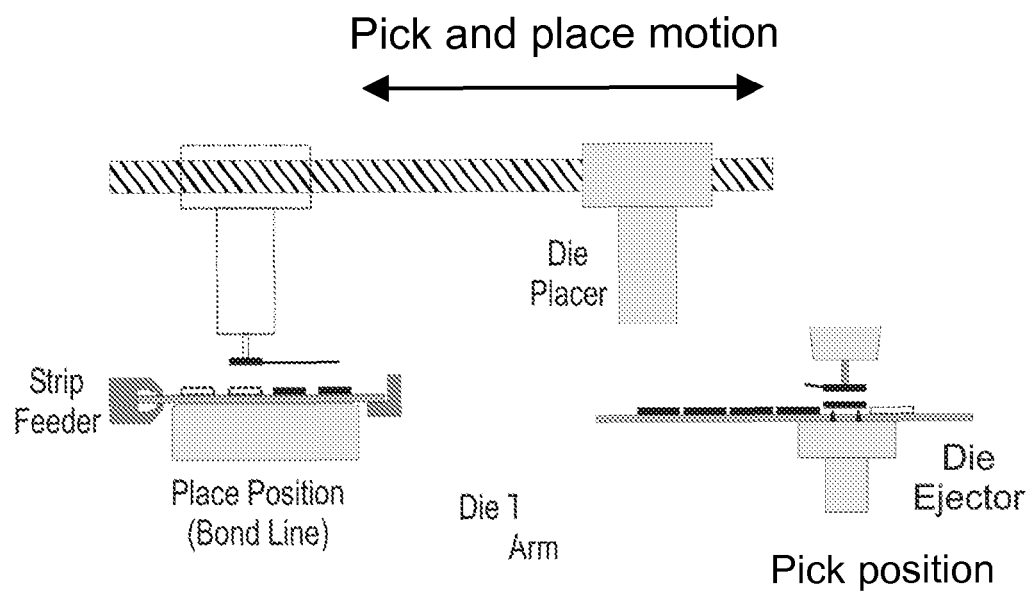
FIGS. 1 and 2 show schematic representations of prior art die bonders.
Figure 2:
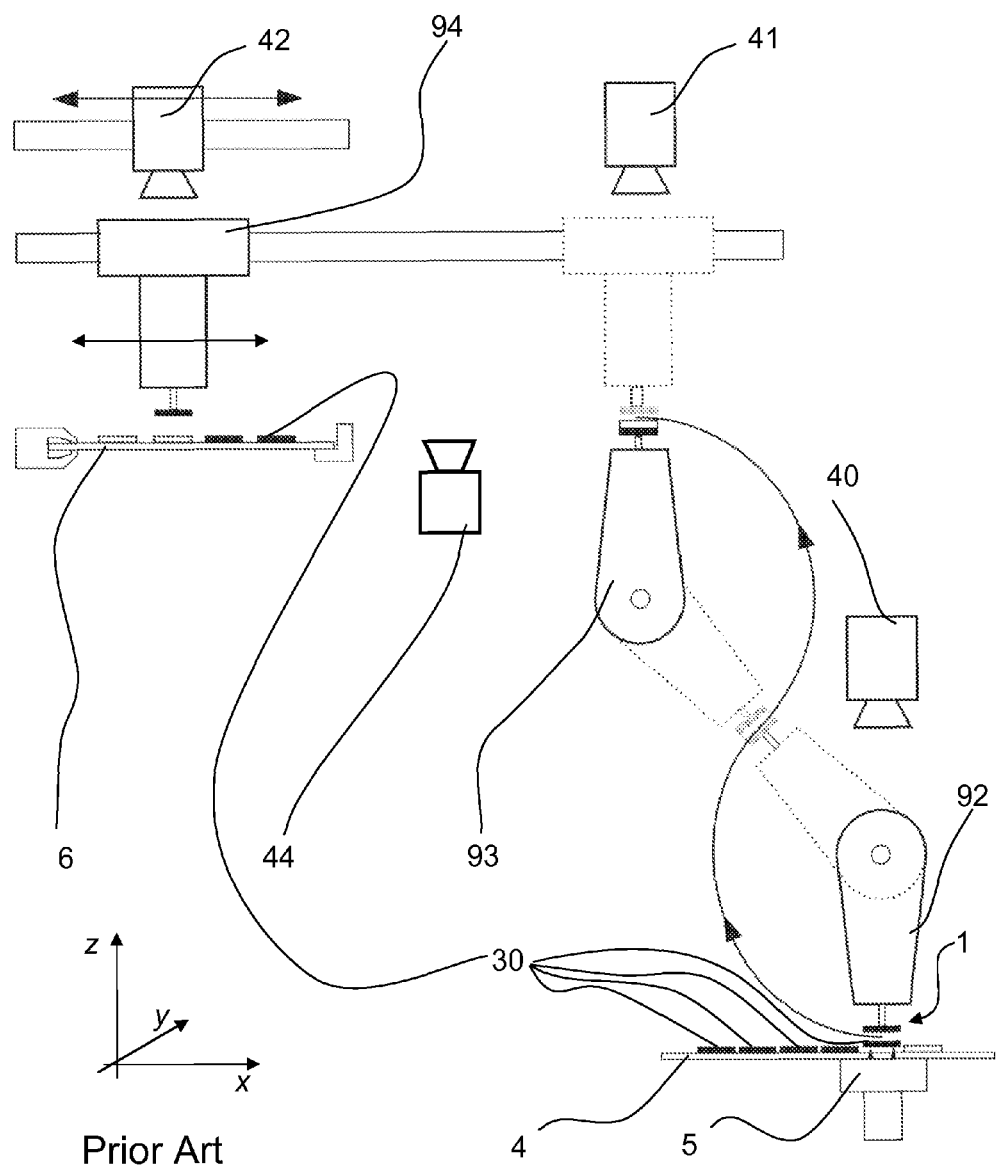
Figure 3:
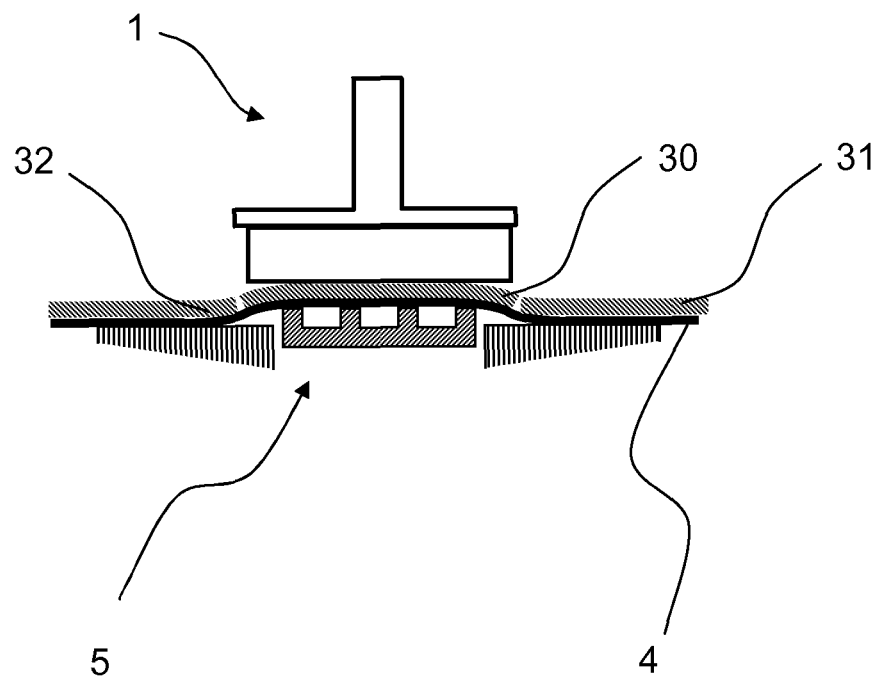
FIG. 3 shows a detail of a pick process carried out by means of a prior art pick tool.
Figure 4:
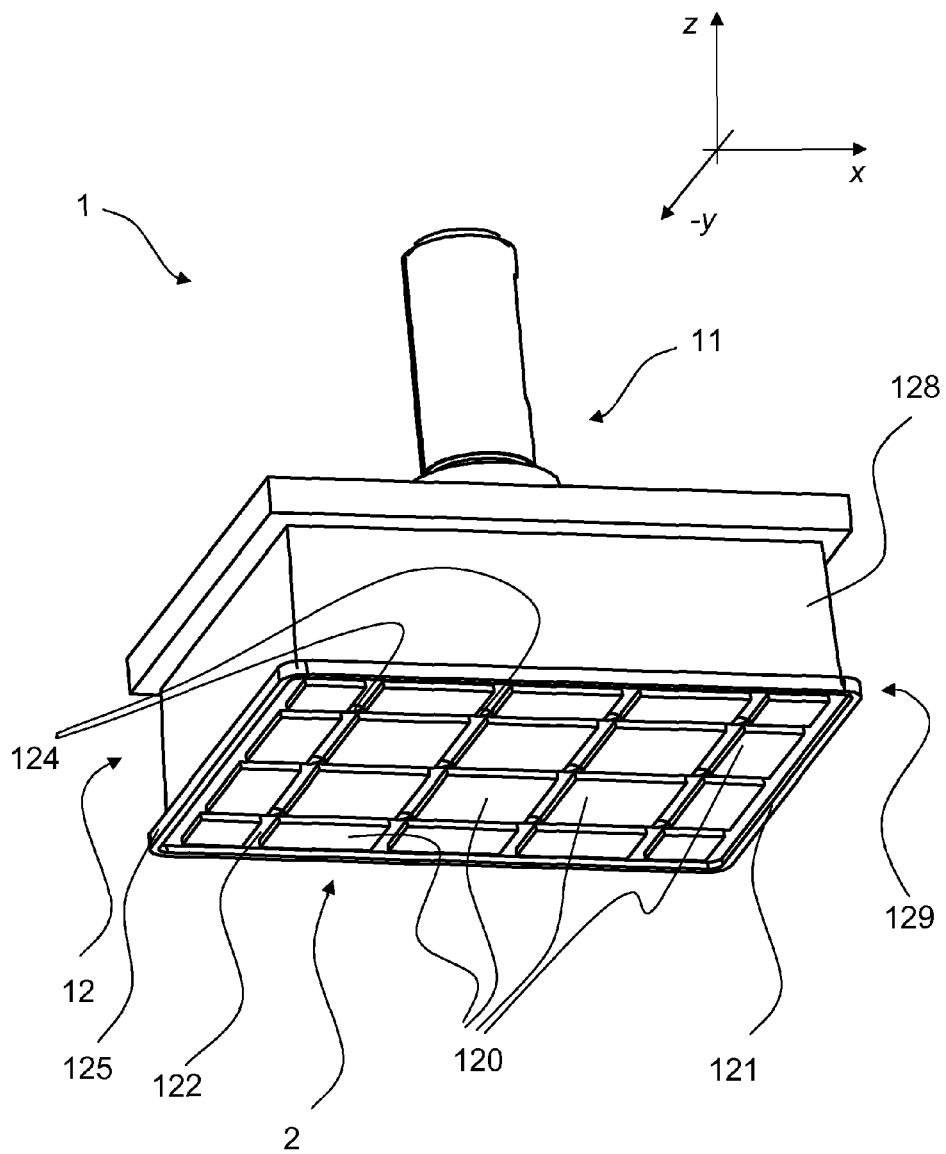
FIG. 4 shows a perspective view of a pick tool in accordance with an exemplary embodiment of the present invention.

FIG. 4 shows a perspective view of a pick tool 1 in accordance with an exemplary embodiment of the present invention. The pick tool 1 comprises a tip holder 11 made of metal and an essentially box-shaped, replaceable tool tip 12 made of an elastomeric material, in particular rubber, preferably silicone rubber. Preferably, the elastomeric material has a Shore A hardness of between 30 and 75, preferably between 40 and 60; and ideally around 50. A rectangular work surface 2 formed on a lower side of the tool tip 12 comprises twenty rectangular contact regions 120, which are separated from one another by first vacuum channels 122. The work surface 2 further comprises an additional contact region 121 that is formed on a sealing ring 125 which in turn is formed on a flange 123 provided along a circumference of a lower part of the tool tip 12, thus forming a flexible lip seal with the additional contact region 121 acting as a sealing surface. First vacuum ducts 124 open into first vacuum channels 122. Flange 123, sealing ring 125, work surface 2 and first vacuum channels 122 form a die contacting portion 129 of the tool tip 12, with the flange 123 and the sealing ring 125 surrounding said die contacting portion 129; i.e. flange 123 and sealing ring 125 are provided on an edge region of the die contacting portion 129 so that the additional contact region 121 surrounds the rectangular contact regions 120. The tool tip 12 further comprises a body portion 128 in which an indentation is formed for mounting the tool tip 12 onto the tip holder 11, and which has a smaller cross section than the die contacting portion 129 in a plane parallel to the work surface, i.e. perpendicular to the z-direction. Thus, a first cross section area of the die contacting portion 129 is larger than a second cross section area of the body portion 128 of the tool tip 12. First vacuum ducts 124 provided in the body portion 128 of the tool tip 12 open into the first vacuum channels 122.

Figure 5:
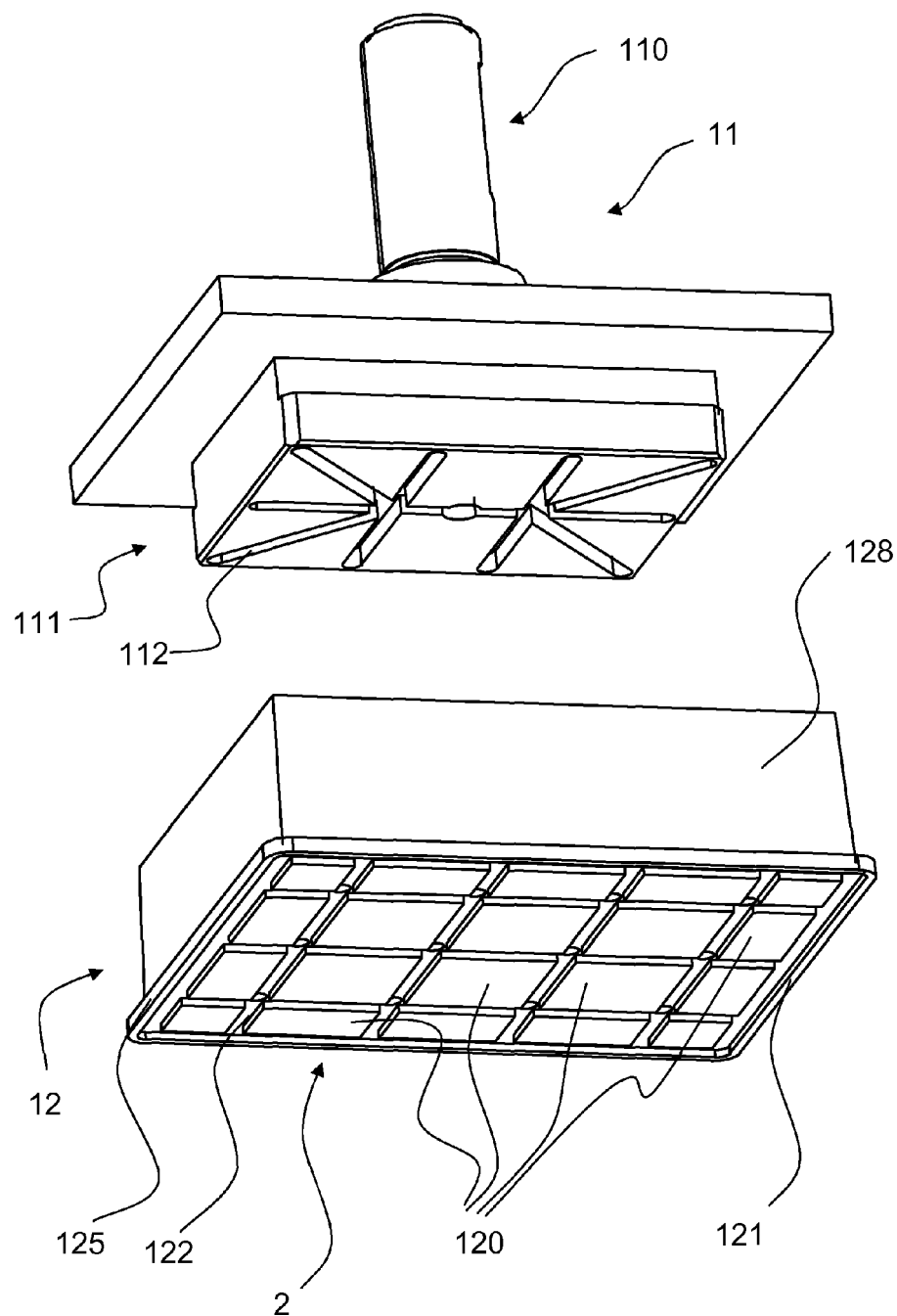
FIG. 5 shows another perspective view of a pick tool 1 in accordance with an exemplary embodiment of the present invention.

As illustrated in FIG. 5, the tool tip 12 may be mounted onto a protruding section 111 which acts as an interface portion of the tip holder 11. Second vacuum channels 112 are formed in a lower surface of the protruding section 111, and connect to the first vacuum ducts 124 provided in the tool tip 12. The tip holder 11 may be attached to a pick unit 92 of a die bonder by means of a shaft 110. One or more second vacuum ducts 113, which are connected to the second vacuum channels 112, are provided in the tip holder 11, comprising the shaft 110.

Figure 6:
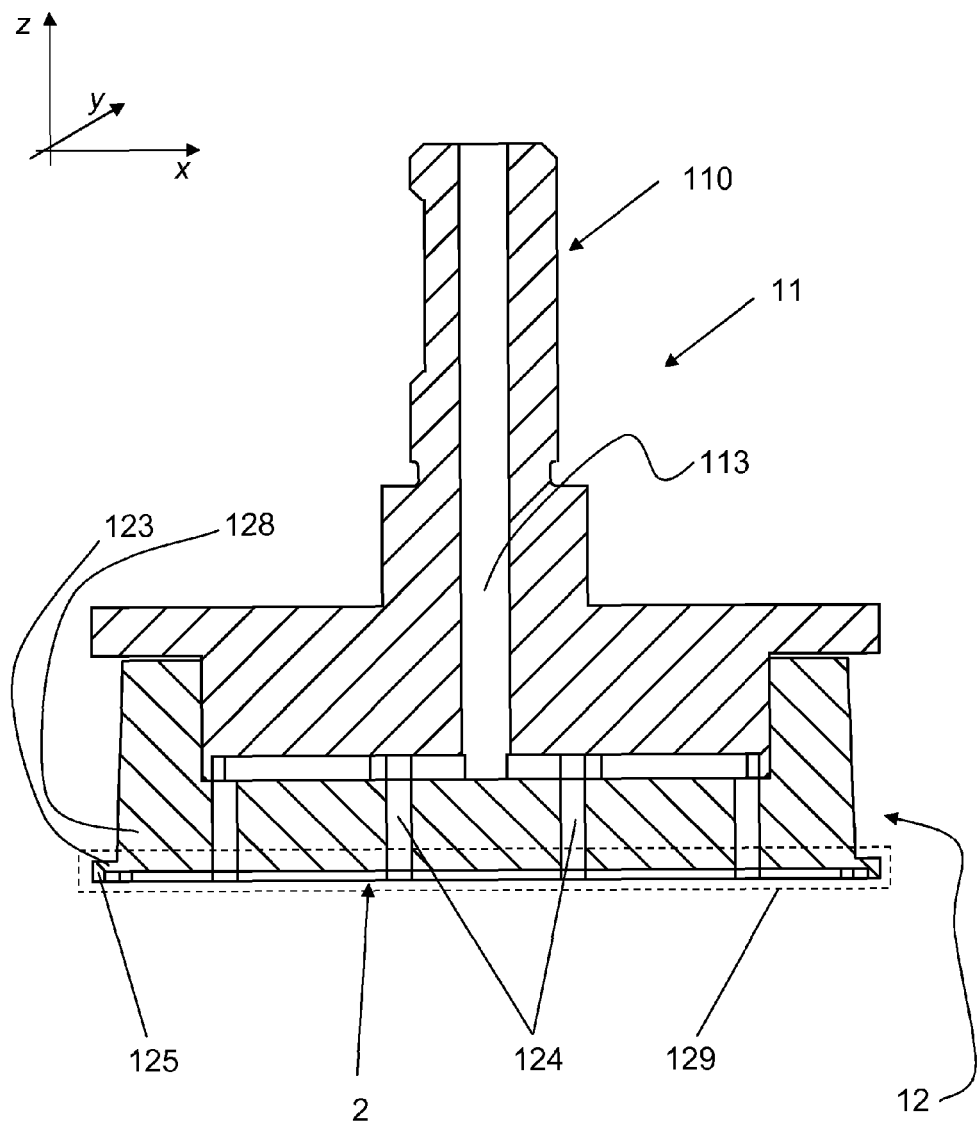
FIGS. 6, 7 and 8 show cross sections of the pick tool shown in FIGS. 4 and 5.
Figure 7:
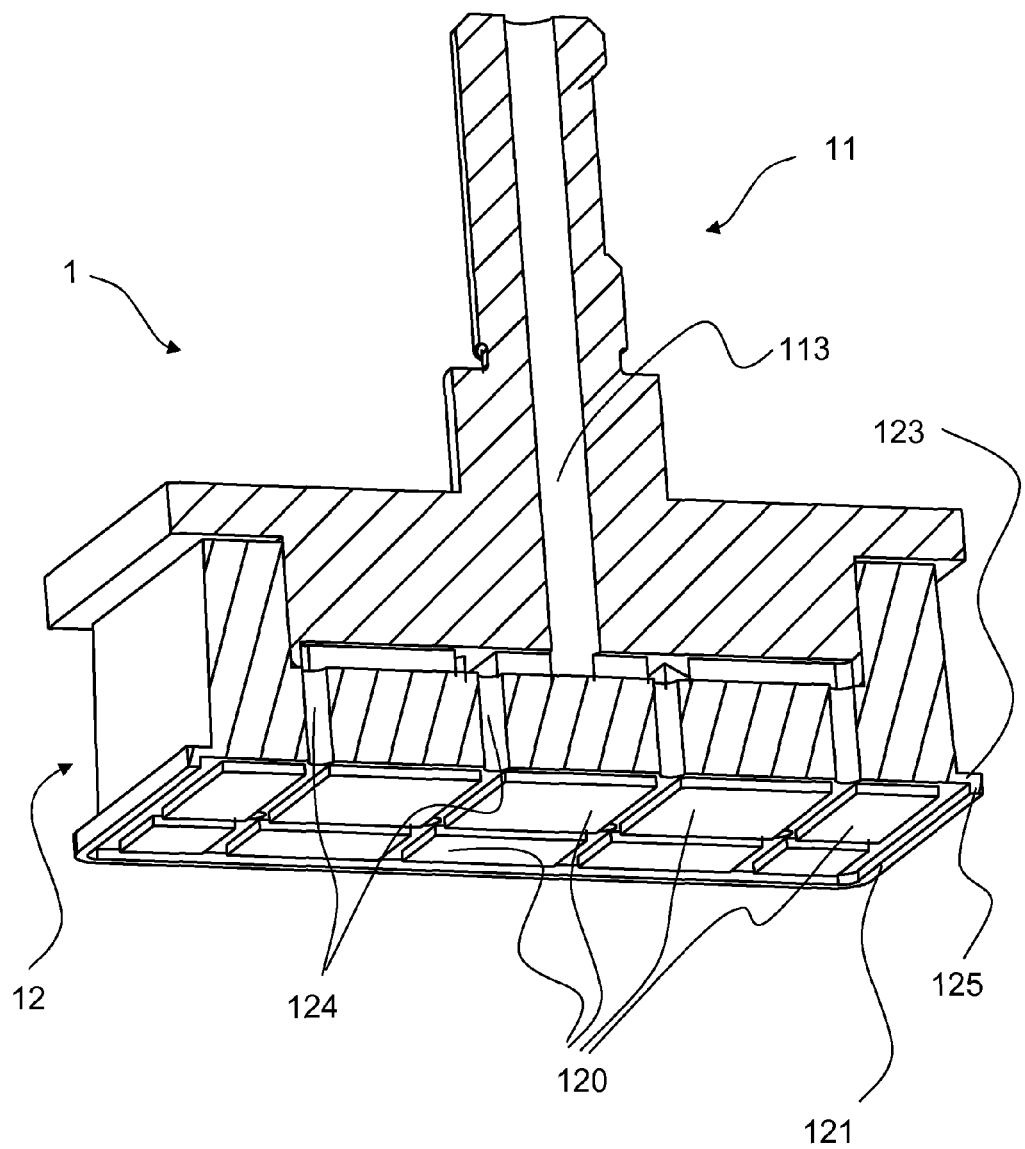
Figure 8:
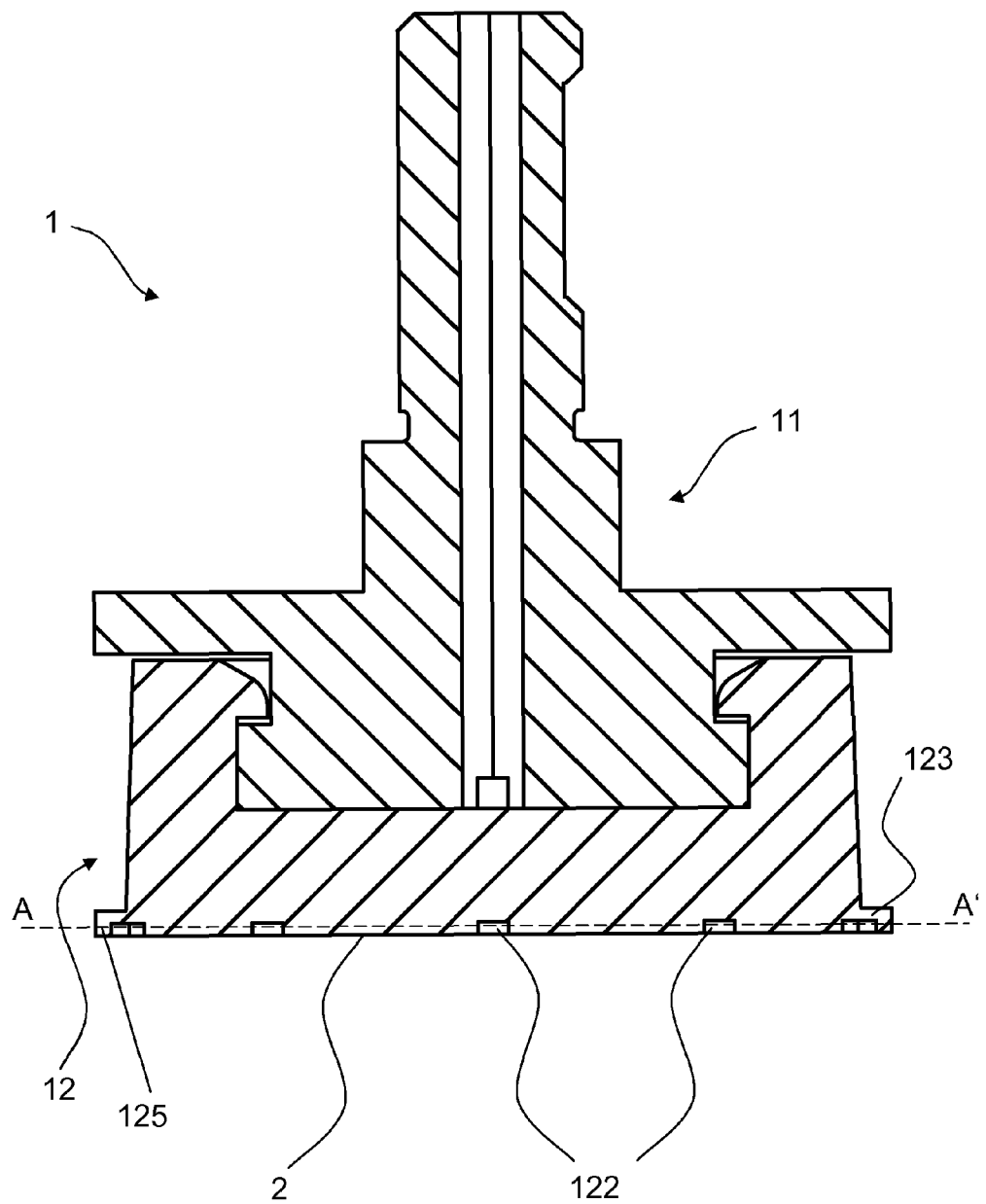

FIGS. 6, 7 and 8 show cross sections of the pick tool 1 shown in FIGS. 4 and 5.

To pick a die 30 from a carrier tape 4, the pick tool 1 is lowered by the pick unit 92 until the work surface 2 comes into contact with a surface of a die 30. A vacuum is then applied to the first vacuum channels 122 through first vacuum ducts 124, and through the second vacuum ducts 113 and channels 112 provided in the tip holder 11. Once the vacuum has been applied, the die 30 is pressed against the work surface 2 by an atmospheric pressure of an air surrounding the die bonder. As a consequence, the die 30 is temporarily fixed to the work surface 2. When the pick tool 1 is lifted again in a pick movement in a +z-direction to detach the die 30 from the carrier tape 4, the carrier tape 4 is being bent downwards, i.e. in −z-direction, in an area underneath the edges of the die 30 due to the fact that a surrounding region of the carrier tape 4 underneath neighbouring dies 31 and 32 is fixed to a support surface of a die ejector 5, e.g. by means of vacuum. As a consequence, the edges of the die 30 are also being bent downwards, i.e. in −z-direction, relative to a central region of the die 30, so that the die 30 becomes deformed.

Figure 9:
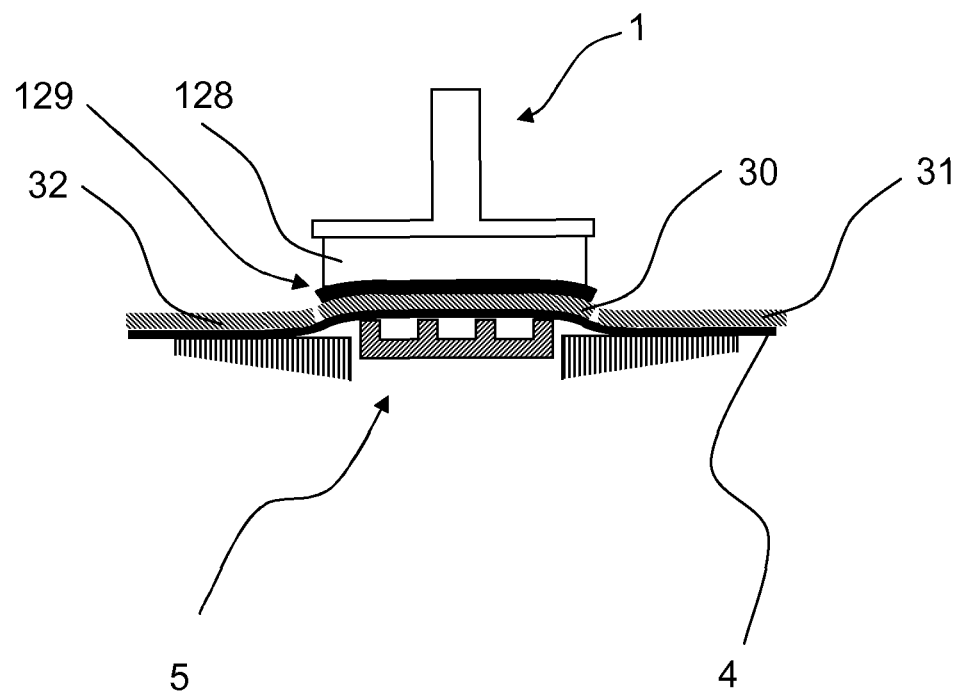
FIG. 9 shows a detail of a pick process carried out with a pick tool in accordance with an exemplary embodiment of the present invention.

Since the flange 123 is relatively thin, it may easily bend downwards, i.e. in −z-direction, due to a compliance of the elastomeric material the tool tip 12 is made of. As a consequence, the additional contact region 121 which acts as sealing surface may advance in −z-direction at the beginning of a pick process. Thus, the flange 123 may provide compliance in a vertical direction between the body portion 128 of the tool tip 12 and the sealing surface. As the pick process continues, the edge region of the tool tip 12, which comprises the flange 123 and the sealing ring 125, may thus bend downwards so that the work surface 2 may become concave and the sealing surface can continue to be in contact with the die 30—and thus maintain a seal—even if the die 30 is deformed substantially due to bending that may occur in particular in the final stages of the pick process, as illustrated in FIG. 9. As a consequence, the vacuum in the first vacuum channels 122 remains intact and the die 30 is held securely by the tool tip 12.

A major benefit of the invention is that a magnitude of die deformation that can be matched without breakdown of the vacuum is much larger than with a conventional tool tip, even if the conventional tool tip is fabricated with a very compliant material.

Also, if vacuum breakdown can be prevented, a likelihood of failed pick attempts due to a loss of vacuum suction between the pick tool 1 and the die 30 can be greatly reduced.

In addition, the die 30 will be subjected to less stress during the pick process. Due to an elastic restoring force of the silicone rubber, the flange 123 exerts a restoration force onto the die 30 via the sealing ring 125 and the sealing surface that reduces bending, thus reducing a risk of chipping, breaking, splitting etc. of the die 30.

As can clearly be seen from FIGS. 4 through 8, all contact regions 120 as well as the additional contact region 121 preferably have planar surfaces; and are preferably all situated at the same z-location. As a consequence, all contact surfaces of the contact regions 120 and the sealing surface of the additional contact region 121 lie in one and the same plane when no die is being held by the pick tool 1. Thus a planar work surface 2 is formed, so that the pick tool 1 is capable of holding a planar thin die without exerting any bending force onto the die that might damage it.

Alternatively, the additional contact region 121 may protrude slightly with respect to the contact regions 120, i.e. be located at a z-location $z_{121}$ somewhat smaller than a z-location $z_{120}$ of the contact regions 120. Preferably, the additional contact region 121 is essentially parallel to the contact regions 120 in this case when no die is being held by the pick tool 1. This way, it can be ensured that the sealing surface provided by the additional contact region 121 may be brought in tight contact with a die to be picked and thus may efficiently seal the vacuum required for securely fixing the die to the pick tool 1 during the pick process. However, if the additional contact region 121 protrudes too far in –z-direction, the working surface 2 becomes essentially non-flat, and the die will thus be substantially bent under the influence of the vacuum, which may lead to damage. Thus, the additional contact region 121 should not protrude more than a few ten micrometers, i.e. preferably $z_{120}$-$z_{121}$<50 μm, preferably $z_{120}$-$z_{121}$<10 μm should hold. Alternatively, the protrusion of the additional contact region may also be designed in such a manner that when the pick tool 1 is pressed against a planar reference surface with a typical pick force of the process for which it is to be used, e.g. a force between 0.5 and 2N, preferably between 0.8 and 1.25 N, all the contact regions 120 as well as the additional contact region 121 come into tight contact with the planar reference surface.

Figure 10:
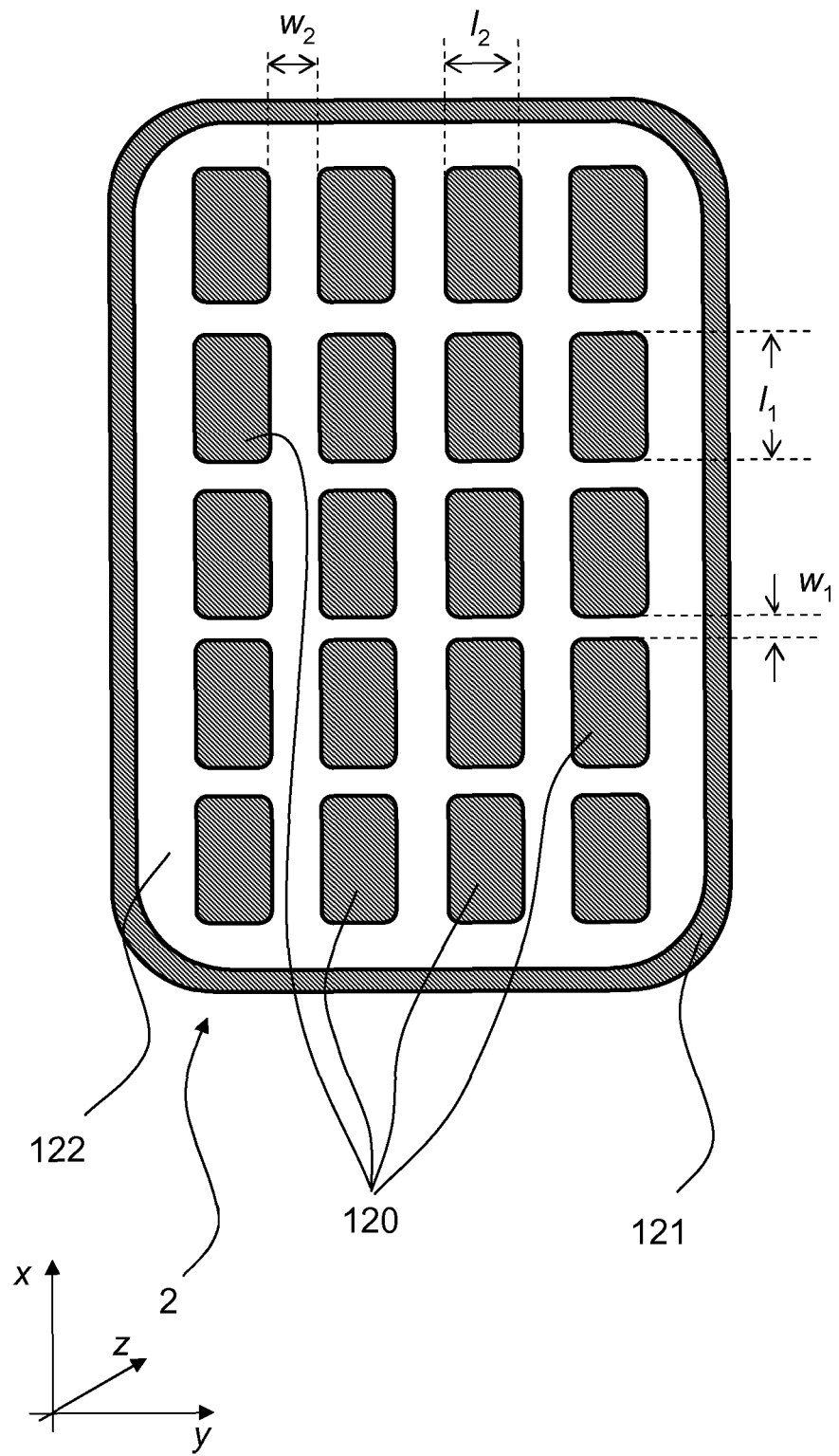
FIG. 10 shows a cross section of the pick tool from FIG. 8 along a line A-A'.
Figure 11:
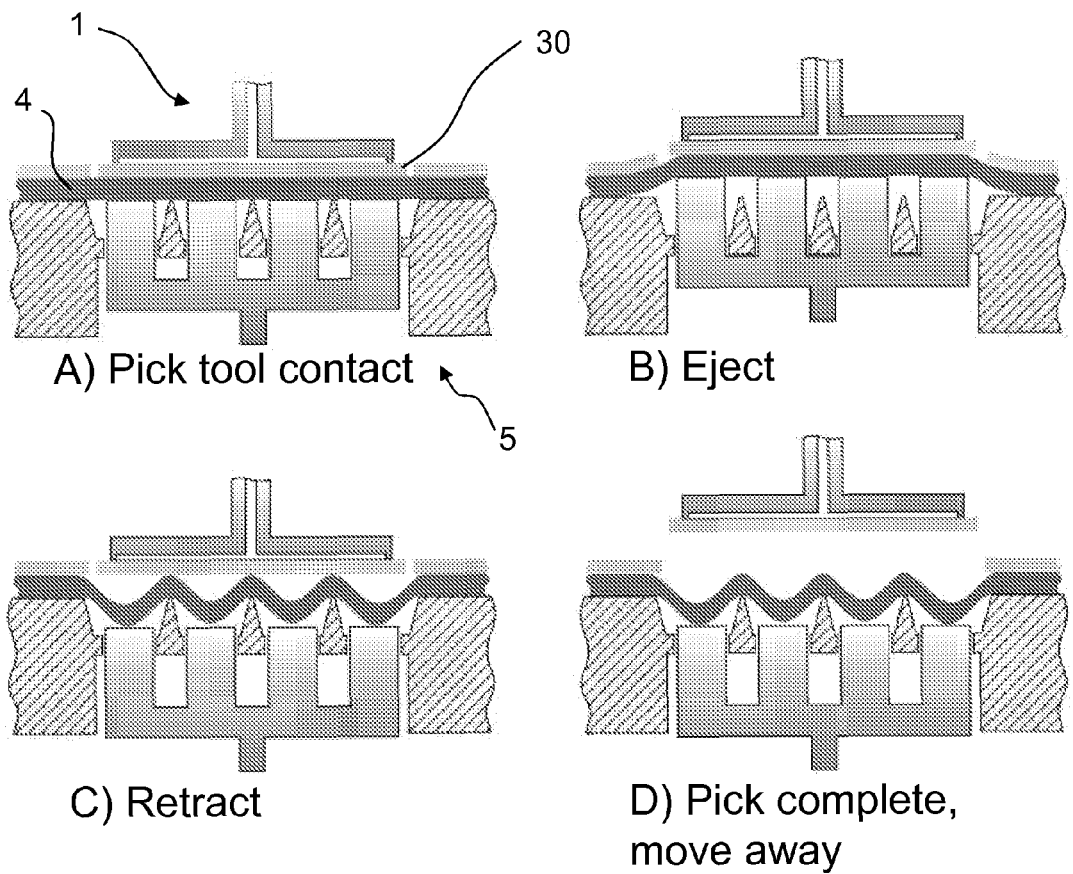
FIG. 11 shows various steps of a pick process.

FIG. 10 shows a cross section of the pick tool from FIG. 8 along a line A-A'. The contact regions have lengths $l_1$ and $l_2$ in x- and y-directions, respectively. The vacuum channels 122 have widths $w_1$ and $w_2$. Preferably, $w_1$ and $w_2$ are significantly smaller than $l_1$ and $l_2$, i.e. $w_n \ll l_m$ for n,m∈{1,2}. Optimum results are achieved if $5w_n < l_m$, preferably $10w_n < l_m$. This provides optimum support for a thin die to be picked by the pick tool 11, and thus avoids that the die will be forced locally to comply to large curvatures when being pressed against the work surface 2 as a consequence of the vacuum present in the vacuum channels 122.

While a pick tool 1 in accordance with the present invention may be used in a die bonder that comprises only a single die handling unit for picking and placing, it is particularly well suited for use in a die bonder that comprises multiple die handling tools, or at least a separate pick unit 92 and place unit 94. In such a configuration, geometry and material parameters of the tool tip 12 may be optimized for maximum pick performance without negative effect on a place process.

Although the invention is illustrated and described herein with reference to specific embodiments, the invention is not intended to be limited to the details shown. Rather, various modifications may be made in the details within the scope and range of equivalents of the claims and without departing from the invention.

In particular, rather than providing the sealing surface of the additional contact region 121 in combination with a flange 123 and a sealing ring 125 as described above, the sealing surface may also be provided by an additional contact region that is formed on a peripheral area of a tool tip 12 and supported by a region of relatively soft elastomeric material, and encloses contact regions 120 located in a central area of the tool tip 12.

In addition, the following are preferred embodiments of the invention as described above:

A pick tool for picking a planar object from a supply station, in particular for picking a semiconductor die from a carrier tape, said pick tool comprising: a work surface, said work surface comprising at least one contact region that may be brought into contact with a first surface on a first side of the planar object; one or more vacuum outlets in the work surface that may be connected to a vacuum source to allow for temporarily fixing the planar object to the work surface; a tool tip; said tool tip comprising a die contacting portion on which the work surface is formed, wherein at least part of the die contacting portion is made from compliant, in particular elastic, material; and a die contacting portion has a bigger cross section than a body portion of the tool tip.

A pick tool for picking a planar object from a supply station, in particular for picking a semiconductor die from a carrier tape, said pick tool comprising: a tool tip; a work surface formed on said tool tip, said work surface comprising at least one contact region that may be brought into contact with a first surface on a first side of the planar object; vacuum outlets in the work surface that may be connected to a vacuum source to allow for temporarily fixing the planar object to the work surface; wherein at least part of the tool tip is made from compliant material, in particular elastic material, so that at least one edge region of the work surface may bend in a direction opposite to a direction of a pick movement of the tool tip.

A pick tool as described in paragraph [0027] or [0028], wherein the work surface may be deformed to become concave.

A pick tool as described in paragraphs [0027] through [0029], wherein the one or more vacuum outlets comprise one or more vacuum channels formed in the work surface. A pick tool as described in paragraphs [0027] through [0030], wherein the work surface comprises at least a first and a second contact region, the two contact regions being disjoint.

A pick tool as described in paragraphs [0030] and [0031], wherein the contact regions are separated by one or more vacuum channels.

A pick tool as described in paragraphs [0031] or [0032], wherein the second contact region is provided along a circumference of the work surface so that said second contact region may act as a sealing surface.

A pick tool as described in paragraphs [0027] through [0033], wherein a flange is provided that surrounds a die contacting portion of the tool tip.

A pick tool as described in paragraphs [0034], wherein the flange is made from compliant, in particular elastic material.

A pick tool as described in paragraphs [0034] or [0035], wherein a sealing ring is formed on the flange.

A pick tool as described in paragraph [0036], wherein the second contact region is formed on the sealing ring.

A pick tool as described above may preferably be obtained by one of the methods as described below:

A method for obtaining a pick tool capable of picking a planar object from a supply station while carrying out a pick movement, in particular for picking a semiconductor die from a carrier tape, the method comprising the steps of a) forming a tool tip on said pick tool so that at least a part of said tool tip consists of compliant, in particular elastic material;

b) forming a work surface on said tool tip, c) forming at least one contact region on said work surface so that said contact region may be brought into contact with a first surface on a first side of the planar object, d) forming vacuum outlets in the work surface that may be connected to a vacuum source to allow for temporarily fixing the planar object to the work surface, wherein e) in step b), the work surface is formed in a vicinity of the compliant material so that at least an edge region of the work surface is capable of bending in a direction opposite to a direction of the pick movement.

A method for producing a tool tip for a pick tool capable of picking a planar object from a supply station, in particular for picking a semiconductor die from a carrier tape, the method comprising the steps of
  a) providing a die contacting portion adjacent to a body portion of said tool tip
  b) forming a work surface on said die contacting portion,
  c) forming at least one contact region on the work surface that may be brought into contact with a first surface on a first side of the planar object,
  d) forming one or more vacuum outlets in the work surface that may be connected to a vacuum source to allow for temporarily fixing the planar object to the work surface, wherein
  e) in step a), at least part of the die contacting portion is made from compliant, in particular elastic, material,
  f) in step b), the die contacting portion is formed to have a first cross section area which is larger than a second cross section area of the body portion of the tool tip.

The invention claimed is:

1. A pick tool for picking a semiconductor die from a carrier tape, said pick tool comprising:
  a. a work surface, said work surface being substantially formed of at least one contact region, the at least one contact region being configured to be brought into complete contact with a first surface on a first side of the semiconductor die,
  b. one or more vacuum outlets in the work surface to be connected to a vacuum source to allow for temporarily fixing the semiconductor die to the work surface, and
  c. a flexible seal provided to contact the first surface on the first side of the semiconductor die, and to maintain vacuum if the semiconductor die becomes deformed, the flexible seal surrounding the work surface.

2. The pick tool according to claim 1, wherein the work surface includes a plurality of planar contact regions for contacting the semiconductor die, the plurality of planar contact regions being disjointed.

3. A pick tool according to claim 1, wherein the flexible seal extends along an edge region of the work surface.

4. A pick tool according to claim 1, wherein
  a. the pick tool includes a tool tip on which the work surface is formed, and wherein
  b. at least part of the tool tip is made from an elastic material so that at least one edge region of the work surface may bend in a direction opposite to a direction of a pick movement of the tool tip to provide the flexible seal.

5. A pick tool according to claim 1, wherein the work surface is concave.

6. A pick tool according to claim 1, wherein the one or more vacuum outlets include one or more vacuum channels formed in the work surface.

7. A pick tool according to claim 1, wherein the work surface includes at least a first contact region and a second contact region, the first contact region and the second contact region being disjoint.

8. A pick tool according to claim 7, wherein the first contact region and the second contact region are separated by one or more vacuum channels.

9. A pick tool according to claim 7, wherein the second contact region is provided along a circumference of the work surface so that said second contact region may act as a sealing surface.

10. A pick tool according to claim 1, wherein the pick tool includes a tool tip on which the work surface is formed, and a flange is provided that surrounds a die contacting portion of the tool tip.

11. A pick tool according to claim 10, wherein the flange is made from an elastic material.

12. A pick tool according to claim 10, wherein a sealing ring is formed on the flange.

13. A pick tool according to claim 12, wherein the work surface includes at least a first contact region and a second contact region, and wherein the second contact region is formed on the sealing ring.

14. A chip processing apparatus, in particular a semiconductor die bonder, said chip processing apparatus comprising:
  a. a pick tool including
    (1) a work surface, said work surface being substantially formed of at least one contact region, the at least one contact region being configured to be brought into complete contact with a first surface on a first side of a chip,
    (2) one or more vacuum outlets in the work surface to be connected to a vacuum source to allow for temporarily fixing the chip to the work surface, and
    (3) a flexible seal provided to contact the first surface on the first side of the semiconductor die, and to maintain vacuum if the chip becomes deformed, the flexible seal surrounding the work surface; and
  b. a place tool for bonding the chip onto a substrate or another chip.

15. The chip processing apparatus according to claim 14, further comprising at least one transfer tool for handing the chip from the pick tool to the place tool.

* * * * *